United States Patent
Omata et al.

(10) Patent No.: US 6,726,816 B2
(45) Date of Patent: Apr. 27, 2004

(54) METHOD FOR FORMING THIN FILM, SPHEROID COATED WITH THIN FILM, LIGHT BULB USING THE SPHEROID AND EQUIPMENT FOR FILM FORMATION

(75) Inventors: Yuuji Omata, Toyonaka (JP); Naotaka Hashimoto, Takatsuki (JP); Masahide Yokoyama, Hirakata (JP); Toshiyuki Suemitsu, Minoo (JP); Takahiro Kitai, Hirakata (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/238,092

(22) Filed: Sep. 9, 2002

(65) Prior Publication Data

US 2003/0008146 A1 Jan. 9, 2003

Related U.S. Application Data

(62) Division of application No. 09/537,622, filed on Mar. 29, 2000, now Pat. No. 6,472,022.

(30) Foreign Application Priority Data

Apr. 9, 1999 (JP) .......................................... 11-102442

(51) Int. Cl.$^7$ .............................................. C25D 17/28
(52) U.S. Cl. ............................ 204/298.02; 204/298.03; 204/298.28; 204/298.29
(58) Field of Search ....................... 204/298.02, 298.03, 204/298.28, 298.29

(56) References Cited

U.S. PATENT DOCUMENTS

| | | |
|---|---|---|
| 2,946,697 A | 7/1960 | Petro |
| 3,621,323 A | 11/1971 | Thomas et al. |

(List continued on next page.)

FOREIGN PATENT DOCUMENTS

| | | |
|---|---|---|
| EP | 0 516 436 | 12/1992 |
| EP | 0 895 275 | 2/1999 |
| JP | 3-232963 | 10/1991 |
| JP | 5-156436 | 6/1993 |
| JP | 6-181048 | 6/1994 |

OTHER PUBLICATIONS

Brett et al. "Radiation–conserving in candescent lamps" Journal of IES, Jul. 1980, pp. 197–203.

Panfilova L. B. et al., "Deposition of Homogeneous Coatings on Hemispherical Surfaces", Instruments and Experimental Techniques, Consultants Bureau, New York, US, vol. 17, Jul. 1, 1974, pp. 1103–1105.

(List continued on next page.)

Primary Examiner—H. Thi Le
(74) Attorney, Agent, or Firm—Merchant & Gould, P.C.

(57) ABSTRACT

The present invention provides a method for forming thin films, wherein thin films with a uniform thickness can be formed on substrates as objects such as spheroids, even when the films are formed by conventional film-formation methods using an incident particle beam coming from a specific direction (e.g., evaporation and sputtering). In the method, thin films are formed on substrates such as spheroids with an incident particle beam coming from a particle source located in a specific direction by performing a spin motion together with a swing motion. The spin motion is a rotation of the substrate at a constant angular velocity about the spheroidal axis. The swing motion is a rotational oscillation of the same substrate for rotationally oscillating the axis at a constant cycle in one surface, where the center of the rotational oscillation is in the vicinity of the midpoint between two focal points on the axis of the spheroid. As a result, thin films with a uniform thickness in both the peripheral direction of the substrate and in the rotational axis direction of the spin motion can be formed even on substrates including spheroids.

2 Claims, 6 Drawing Sheets

U.S. PATENT DOCUMENTS

| | | | |
|---|---|---|---|
| 4,192,253 | A | 3/1980 | Aichert et al. |
| 4,851,095 | A | 7/1989 | Scobey et al. |
| 5,320,877 | A | 6/1994 | Nakaue et al. |
| 5,616,224 | A | 4/1997 | Boling |
| 5,925,410 | A | 7/1999 | Akram et al. |
| 6,059,885 | A | 5/2000 | Ohashi et al. |
| 6,159,290 | A | 12/2000 | Clarke et al. |
| 6,183,810 | B1 | 2/2001 | Ota |
| 6,235,171 | B1 * | 5/2001 | Yamamoto |
| 6,303,008 | B1 * | 10/2001 | Pichulo et al. |
| 6,309,692 | B1 | 10/2001 | Nakamura et al. |
| 6,336,837 | B1 | 1/2002 | Maeda |
| 6,352,747 | B1 | 3/2002 | Blackburn et al. |
| 6,395,156 | B1 * | 5/2002 | Hsueh et al. |
| 6,472,022 | B1 * | 10/2002 | Omata et al. |
| 6,485,616 | B1 * | 11/2002 | Howard et al. |

OTHER PUBLICATIONS

Bergman R. S. et al., "Application of Thin Film Reflecting Coating Technology to Tungsten Filament Lamps", IEE Proceedings A. Physical Science, Measurement & Instrumentation, Management & Education, Institution of Electrical, vol. 140, No. 6, Nov. 1, 1993, pp. 418–428.

* cited by examiner

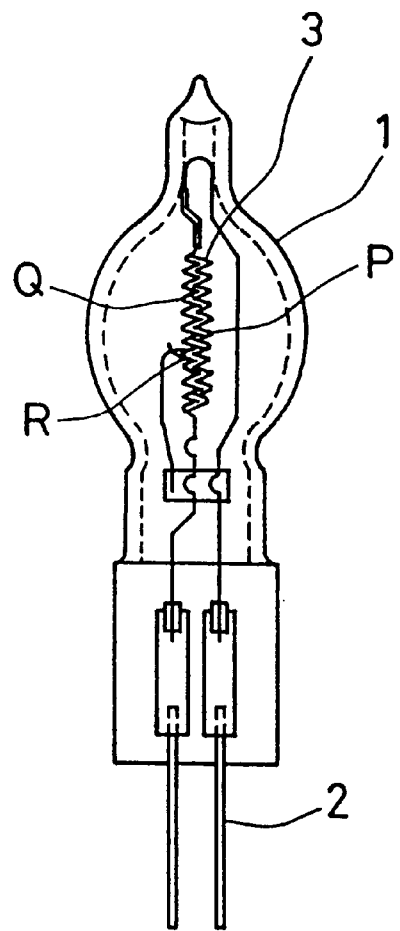
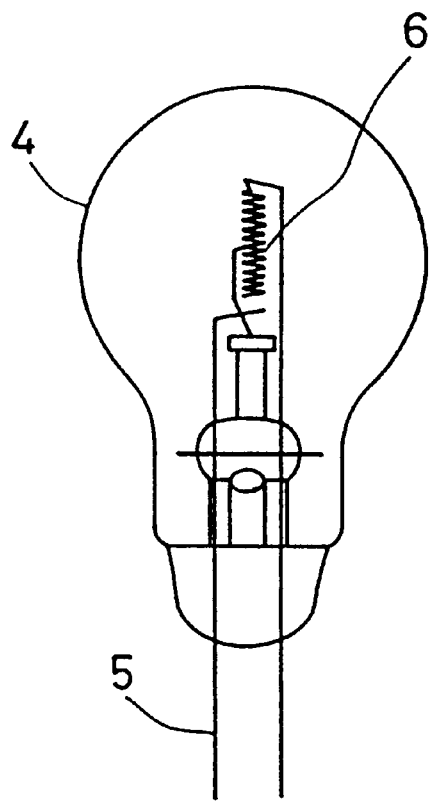
FIG. 3A                    FIG. 3B

METHOD FOR FORMING THIN FILM, SPHEROID COATED WITH THIN FILM, LIGHT BULB USING THE SPHEROID AND EQUIPMENT FOR FILM FORMATION

FIELD OF THE INVENTION

The present invention relates to a method for forming infrared reflection films used for light sources such as incandescent lamps or tungsten-halogen lamps. The present invention relates also highly efficient light sources as light bulbs provided with the infrared reflection films.

BACKGROUND OF THE INVENTION

'Journal of Illuminating Engineering Society', July 1980 (p.197–203) or some other documents have suggested methods for providing low power incandescent lamps and tungsten-halogen lamps. For this purpose, light bulbs are coated with infrared reflection films to substantially pass only visible light that is selected from light beams emitted from filament portions of the light bulbs.

In this method, a maximum proportion of the infrared reflection light, which appears to compose 70–80% of the radiation energy, can be reflected inside of the light bulb. The reflected light is focused on the filament coil portion to heat the same portion. Since the filament coil portion is reheated in this manner, the consumed power is reduced by 20–30% in comparison with a conventional light bulb when the illuminance (total value of luminous flux) from the filament portions is equivalent.

Such an infrared reflection film includes an interference multilayer film having a laminate of transparent dielectric thin films with high refractive index and low refractive index. The interference multilayer film decreases infrared rays escaping as heat rays from the light bulb, and it selectively passes visible light only, so that the infrared rays can be reflected effectively.

To form infrared reflection films with the best uniformity on three-dimensional objects (in many cases, spheroids) such as light bulbs, various methods such as CVD, evaporation or sputtering are used.

In the above-mentioned interference multilayer films, the films are required to be coated with an accurate thickness while they have desired refractive indices. Evaporation and sputtering are useful in forming thin films with a controlled thickness on conventional flat substrates. However, the methods are not suitable for forming thin films with a uniform thickness on three-dimensional objects including spheroids such as light bulbs.

In a case of a three-dimensional object, generally, the distance from the object to either an evaporation source or a sputtering target can vary. Moreover, the other side (the side away from the evaporation source or the target) of the object should be also coated with a film. As a result, the film has a considerably uneven thickness, and the multilayer film cannot show its functions, and the efficiency of the infrared ray reflection will deteriorate.

Furthermore, visible light of a wavelength to be transmitted is reflected excessively due to the film with uneven thickness. As a result, problems such as coloration and color unevenness will occur in the electric light source.

CVD is used for forming thin films by using starting molecules which are supplied as a gas flow from substantially all directions rather than a specific direction. This method can provide comparatively uniform film thickness without any special difficulties. However, CVD also presents several problems, for example, the absolute value of the film thickness cannot be controlled sufficiently. In addition, the object will be heated inevitably, and the material gasses or the conditions should be changed for the respective films composing a laminate.

SUMMARY OF THE INVENTION

To solve the problems, the present invention provides a method for forming thin films with a uniform thickness on substrates including spheroids even by film-forming methods such as evaporation or sputtering. In evaporation or sputtering, incident particles as film materials will be supplied from a specific direction. The present invention also provides a spheroid coated with a film of the method, a light bulb including the spheroid and equipment for film formation.

In order to achieve the purpose, the method for forming thin films according to the present invention includes forming a thin film on a substrate including a spheroid with an incident particle beam coming from a particle source located in a specific direction when viewed from the substrate. In this method, a spin motion and a swing motion are performed together. The spin motion is a rotation of the substrate at a constant angular velocity about the spheroidal axis. Here, 'spheroidal axis' refers to the central axis of the rotation of a spheroid. The swing motion is a rotational oscillation of the same substrate for rotationally oscillating the axis at a constant cycle in one surface, where the center of the rotational oscillation is in the vicinity of the midpoint between two focal points on the axis of the spheroid.

In the method using a spin motion and a swing motion together, a thin film that has a uniform thickness in the peripheral direction of the substrate and in the rotational direction of the spin motion can be formed even if the substrate comprises a spheroid.

It is preferable in the method that the swing motion is performed to get the part of the substrate below the midpoint of the axis positioned away from the particle source when the upper part of the same axis approaches the particle source, so that the uniformity of the thin film in the rotational axis direction is further assured.

It is also preferable that the particle source is a flat plate and the swing motion is performed to rotationally oscillate the axis at a constant cycle in a surface perpendicular to the flat plate surface, so that the uniformity of the thin film in the rotational axis direction is further assured.

It is preferable that the rotational angular velocity of the rotational oscillation of the swing motion is varied continuously, so that the rotational velocity of the swing motion can be set to be suitable for the distance distribution between the substrate surface and the particle source surface.

It is preferable that the rotational oscillation is varied intermittently by setting plural stationary positions within the rotational oscillation range and also stationary times at the respective positions, so that the swing motion can be performed easily.

It is preferable that the thin film is formed by either sputtering or evaporation.

It is preferable that the thin film is at least one selected from the group consisting of an infrared reflection film and a frost film.

It is also preferable that the substrate including a spheroid is a light bulb.

It is preferable that the center of the rotational oscillation of the swing motion is in the vicinity of the longitudinal center of the filament portion of the light bulb.

A spheroid of the present invention is coated with a thin film, and the thin film is formed with an incident particle beam coming from a particle source located in a specific direction when viewed from the spheroid as an object. The spheroid is subjected to a spin motion together with a swing motion in order to form a thin film thereon. The spin motion is a rotation of the spheroid at a constant angular velocity about the spheroidal axis. The swing motion is a rotational oscillation of the same spheroid for rotationally oscillating the axis at a constant cycle in one surface, where the center of the rotational oscillation is in the vicinity of the midpoint between two focal points on the axis of the spheroid. The thin film has a uniform thickness at least in the rotational direction of the spin motion and also in the rotational oscillation direction of the swing motion.

The spheroid coated with the thin film is useful for light bulbs due to the uniformity in the film thickness.

It is preferable in the spheroid that the swing motion is performed to get the part of the spheroid below the midpoint of the axis positioned away from the particle source when the upper part of the same axis approaches the particle source, so that the uniformity of the thin film in the rotational axis direction is further assured.

It is also preferable that the particle source is a flat plate and the swing motion is performed to rotationally oscillate the axis at a constant cycle in a surface perpendicular to the flat plate surface, so that the uniformity of the thin film in the rotational axis direction is further assured.

It is preferable that the thin film is formed by sputtering or by evaporation.

It is also preferable that the thin film is at least one selected from the group consisting of an infrared reflection film and a frost film.

It is preferable that the spheroid is a light bulb.

It is preferable that the center of the rotational oscillation of the swing motion is in the vicinity of the longitudinal center of the filament portion of the light bulb.

A light bulb of the present invention includes a spheroid coated with a thin film. The film on the light bulb is substantially uniform in thickness, since it is formed with an incident particle beam coming from a specific direction while the spheroid (light bulb) is subjected to a swing motion together with a spin motion. In order to meet the requirement for the uniformity, the film thickness on the spheroidal substrate in a range of ±60° from the vertical angle (see the upper right-hand in the graph of FIG. 1) is at least 88% of the maximum film thickness, i.e., ±6% to the medium value. When the thin film is a laminate comprising transparent dielectric thin films differing in their refractive indices, the light bulb can be prevented from being colored or having color unevenness, and the energy will be saved considerably.

Film-formation equipment of the present invention is used to form thin films having a uniform thickness on substrates comprising spheroids with an incident particle beam coming from a particle source located in a specific direction when viewed from the substrates. The equipment is provided with a rotational mechanism to perform a spin motion together with a swing motion. The spin motion is a rotation of the spheroid at a constant angular velocity about the spheroidal axis. The swing motion is a rotational oscillation of the same spheroid for rotationally oscillating the axis at a constant cycle in one surface, where the center of the rotational oscillation is in the vicinity of the midpoint between two focal points on the axis of the spheroid.

It is preferable that the equipment uses RF (radio frequency) sputtering or DC (direct current) sputtering in the film formation process.

BRIEF DESCRIPTION OF THE DRAWINGS

FIGS. 3A and 3B are schematic views to show light bulbs to be coated with thin films by the methods of the present invention.

DETAILED DESCRIPTION OF THE INVENTION

Figure 1:
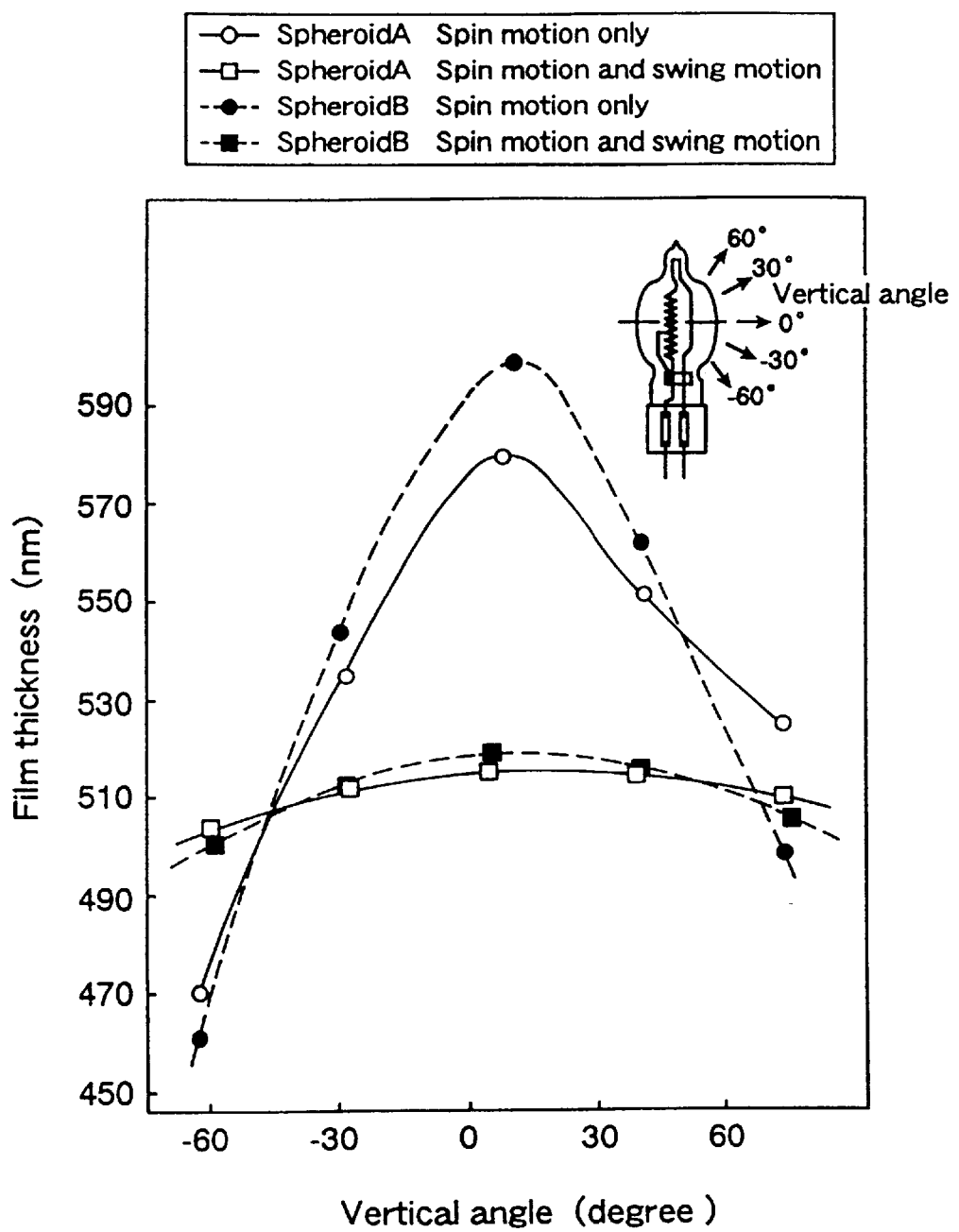
FIG. 1 is a graph to show a relationship between the vertical angle on a light bulb and the thickness of a film, where the film is formed by the method in a first embodiment of the present invention.

Embodiments of the present invention are explained specifically below by referring to FIGS. 1–6. FIGS. 3A and 3B exemplify the configurations of light bulbs used in the embodiments. Both a light bulb 1 in FIG. 3A and a light bulb 4 in FIG. 3B include spheroids. Filaments in the light bulbs focus infrared rays. Since the length of the filaments is restricted in view of energy-saving, a typical light bulb includes a spheroid having a proper ratio of the long axis to the short axis. Hereinafter, the figure of the light bulb 1 is referred to as "spheroid A" while that of the light bulb 4, which is a substantial sphere, is referred to as "spheroid B".

The light bulbs have filaments 3, 6 and electrode terminals 2, 5 respectively. "P" in FIG. 3A indicates a midpoint between two focal points (Q and R) on the rotational axis of the spheroid. FIG. 3B also has a similar midpoint though it is not shown. The midpoint P is typically located on a filament coil in the longitudinal direction.

First Embodiment

In this embodiment, an $SiO_2$ thin film was formed on a light bulb with RF sputtering. The target was a flat plate 200 mm in width and 900 mm in length.

A spin motion and a swing motion were performed together to prevent the film on the light bulb from having uneven thickness. The spin motion is a rotation of the light bulb at a constant angular velocity about the spheroidal axis. The swing motion is a rotational oscillation of the same light bulb for rotationally oscillating the axis at a constant cycle in one surface, where the center of the rotational oscillation is the midpoint P. In the spin motion, the spheroid rotates about the axis of the filament at a regular angular velocity of 100 rpm.

Though the spin motion can provide a thin film with a thickness uniform in the rotational direction, a swing motion should be carried out together with the spin motion in order to provide a film with a thickness uniform in the rotational axis direction.

The swing motion is a rotational oscillation at a constant cycle, where the spheroidal axis undulates at ±60 degrees from the midpoint P in a surface parallel to the flat plate target (see, the upper right-hand in the graph of FIG. 1). The swing motion is not effective if the rotational amplitude surface is parallel to the target surface. In the First Embodiment, the rotational axis of the spheroid is set to move in a surface perpendicular to the target surface. More specifically, the axis oscillates rotationally so that the part of the spheroid below the midpoint P of the spheroidal axis is positioned away from the flat plate target when the part above the midpoint P of the same axis approaches the flat plate target during the swing motion.

The rotational velocity of the swing motion should be set corresponding to the distance distribution between the substrate surface and the flat plate target surface, since the distance depends on the spheroidal shape in the rotational axis direction of the light bulb (an object). When the spheroid is made to be a substantial sphere (spheroid B), the swing motion substantially becomes a simple harmonic oscillation.

Figure 4:
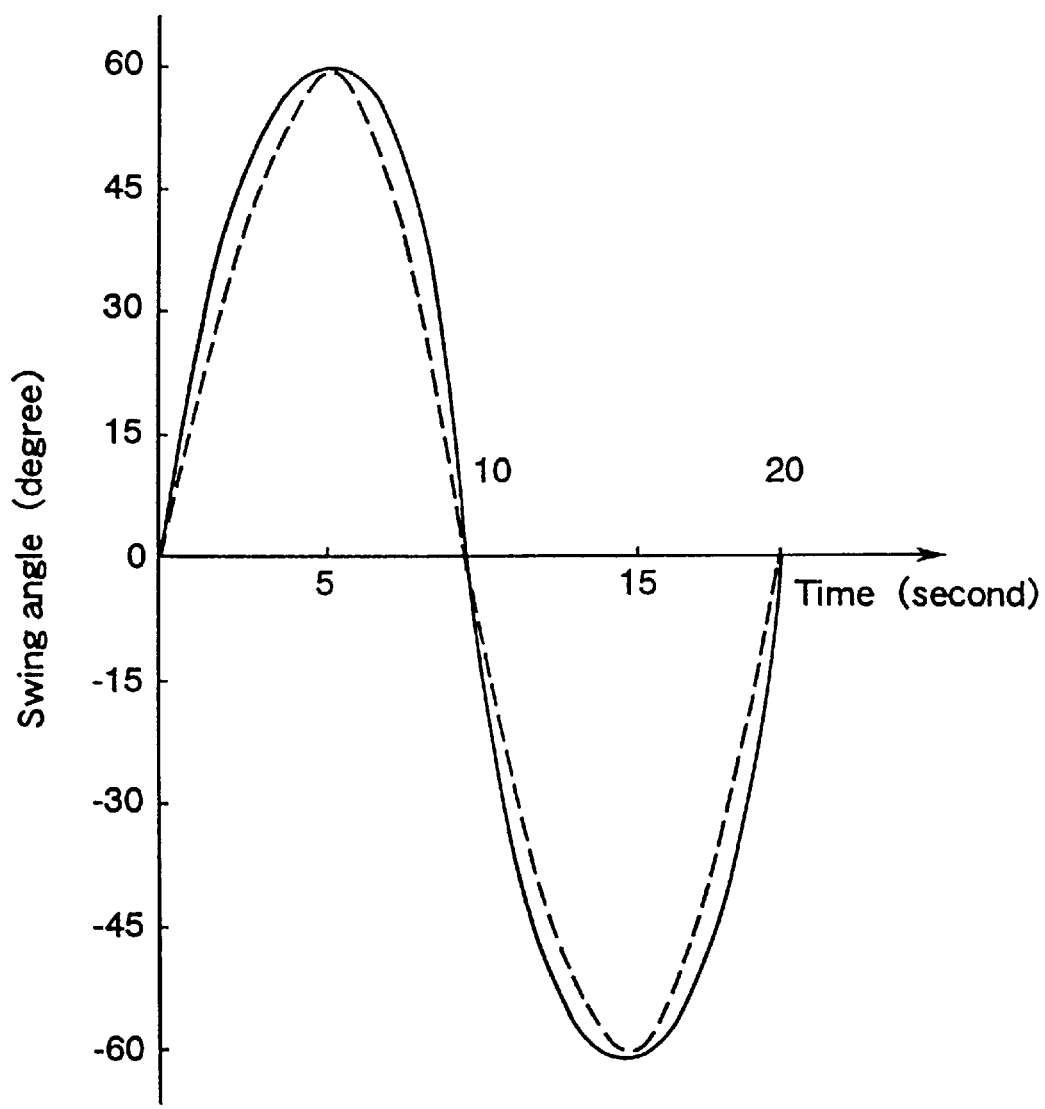
FIG. 4 is a graph to exemplify a swing motion in film formation according to the first embodiment.

In the First Embodiment, one cycle of the swing motion is 20 seconds, and the swing angle of the rotational axis shifts in one cycle as indicated in FIG. 4 (hereinafter, it is called "a continuous swing mode"). The solid line in FIG. 4 indicates a continuous swing mode for a light bulb with a spheroid A, while the broken line indicates the same for a light bulb with a spheroid B.

Figure 2:
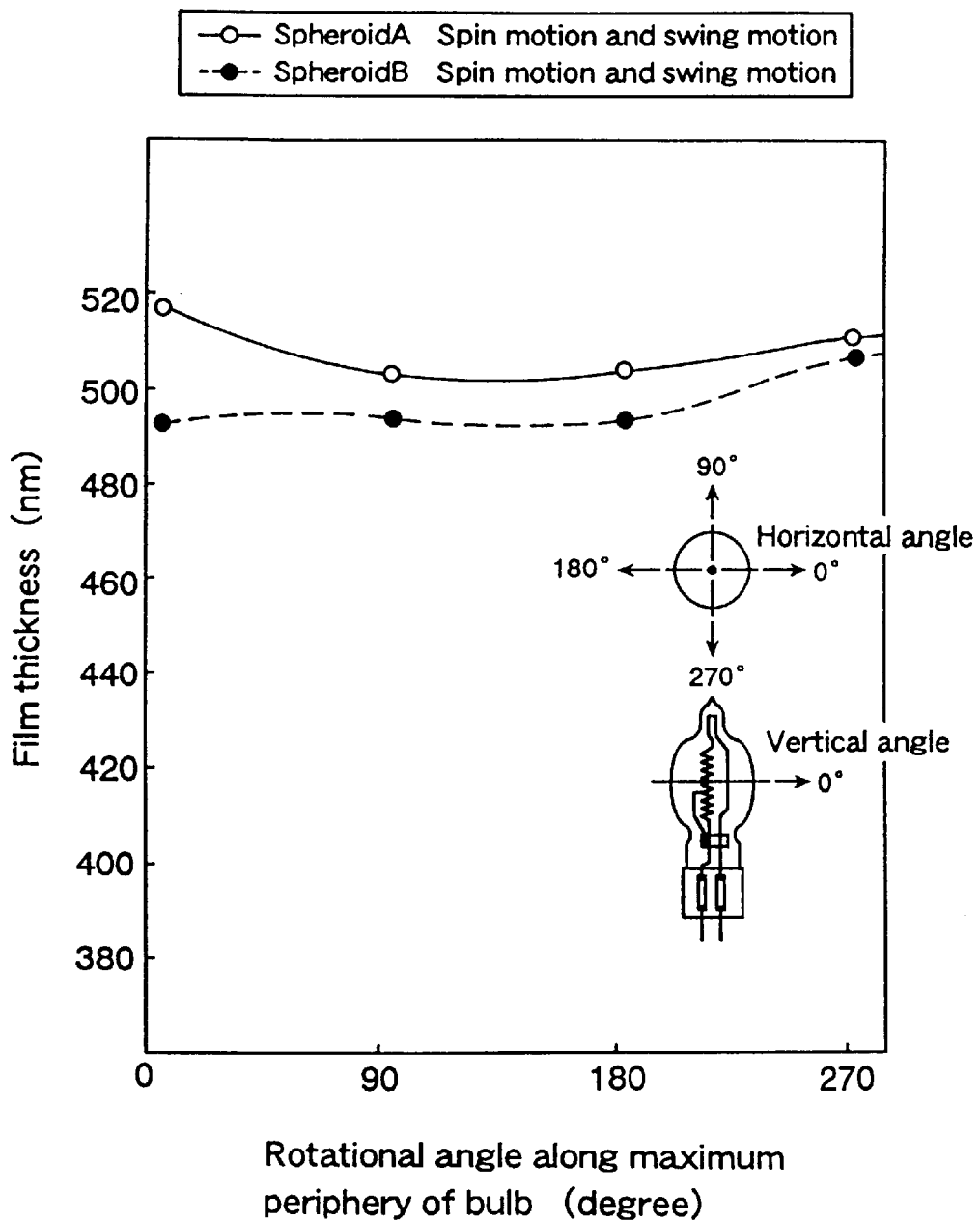
FIG. 2 is a graph to show a relationship between the rotational angle along the periphery of a bulb and the film thickness, where the thin film is formed by the method in the first embodiment of the present invention.

FIGS. 1 and 2 shows results of measurement on the film thickness distribution for the spheroids A and B, where a spin motion was performed alone or together with a swing motion. The distance between the flat plate target surface and the rotational axis of spheroids (light bulb filaments) was set to be 90 mm.

FIG. 1 shows the thickness distribution of a film formed on spheroids of light bulbs in the rotational axis direction. FIG. 1 shows also a measurement result as a comparative example obtained by forming a film using only a spin motion but not a swing motion. FIG. 2 shows a thickness distribution of a film in the direction of the cross-sectional circumferential direction (spin rotational direction) perpendicular to the rotational axis.

The ordinate in FIG. 1 indicates thickness (nm) of an $SiO_2$ film. The abscissa indicates positions of a light bulb surface corresponding to vertical angles (elevation angle) of a surface that is perpendicular to the rotational axis of a spheroid comprising the midpoint P. For the vertical angle, the direction inverse to the light bulb terminals is determined to be the plus direction, while the light bulb terminal side is determined to be the minus direction (see upper right-hand in FIG. 1).

The ordinate in FIG. 2 indicates thickness (nm) of an $SiO_2$ film. The abscissa indicates positions on the light bulb periphery on a surface perpendicular to the rotational axis of a spheroid including the midpoint P. The zero-degree direction is the position where a mount is provided to the filament on the rotational axis. The angles are displayed by determining the counterclockwise direction as the plus direction about the rotational axis relative to the zero-degree when viewed from the top of the light bulb (right-center in FIG. 2).

FIGS. 1 and 2 show that films can be formed on light bulbs with a substantial uniformity in both the vertical and horizontal directions when a swing motion is performed together with a spin motion.

The measurement result in FIG. 1 shows that additional use of a swing motion is remarkably effective when compared with the result obtained by using only a spin motion. The problem of uneven thickness of the thin film formed on a bulb cannot be solved by using a spin motion alone, especially when the thin film is formed with an incident particle beam coming from a particle source located in a specific direction when viewed from the object (e.g., RF sputtering).

Second Embodiment

In the Second Embodiment, an $SiO_2$ thin film was formed on a light bulb surface by using RF sputtering as in the First Embodiment. This embodiment is distinguishable from the First Embodiment in that the swing motion is not a continuous motion as shown in FIG. 4 but an intermittent motion as shown in FIG. 6 (hereinafter, it is called "a step-swing mode").

Figure 6:
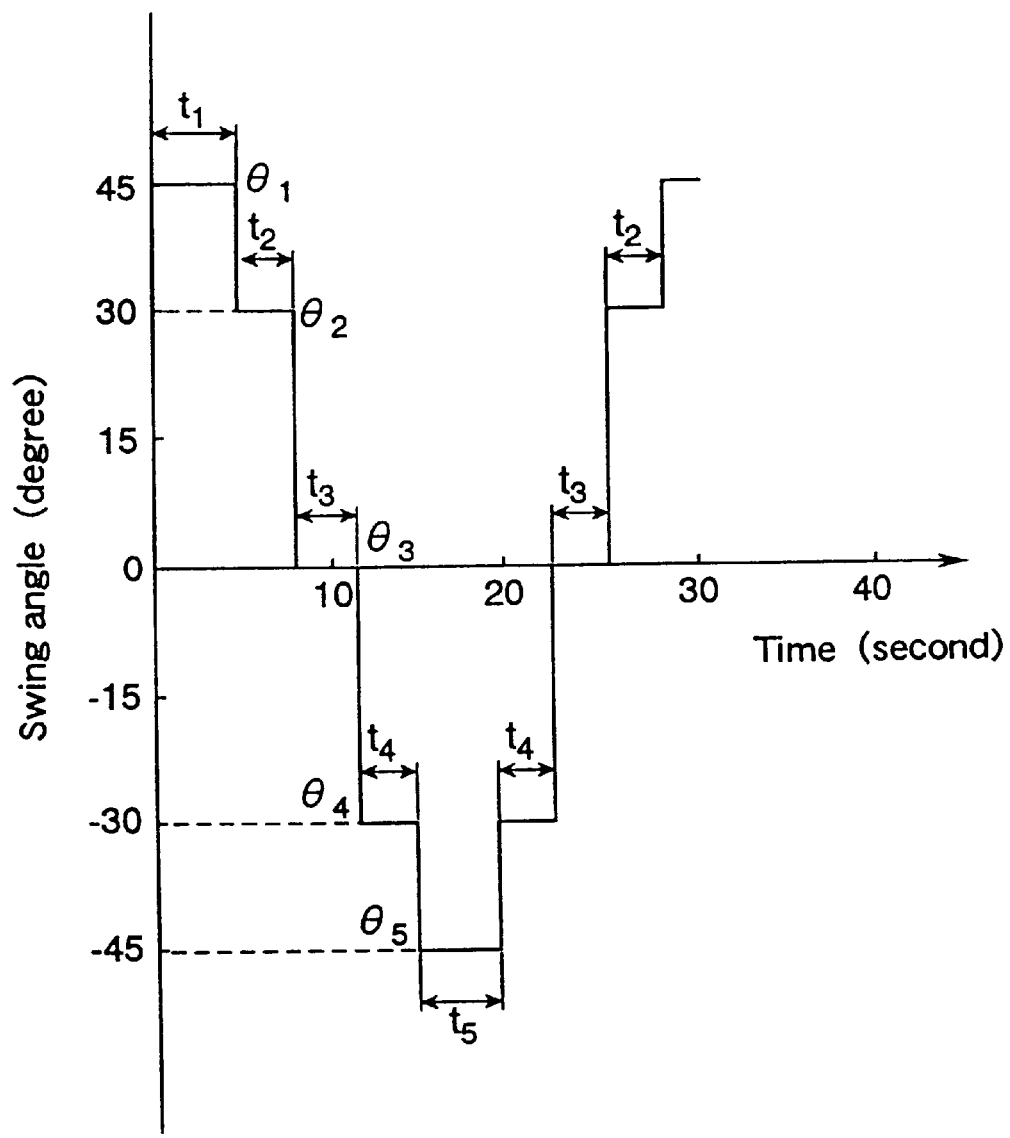
FIG. 6 is a graph to exemplify a swing motion in film formation according to the second embodiment.

In a step-swing mode in FIG. 6, an oscillation angular range of a rotational oscillation in a swing motion of a predetermined cycle is divided to be set as plural stationary angles ($\theta n$), and stationary times ($tn$) for the respective stationary angular positions are also set. More specifically, the rotational motion of the swing is set as ($\theta 1$, $t1$)... ($\theta n$, $tn$) within the range of the amplitude angles. The step-swing mode can be provided in a simple manner compared to the continuous swing mode described in the First Embodiment.

In this embodiment, n=5, and the rotational angular range of the swing amplitude is set to be ±45 degrees to the medium value. As shown in FIG. 6, the cycle of the rotation is set with a step-swing mode, in which ($\theta 1$, $t1$)=(−45°, 5.3 seconds); ($\theta 2$, $t2$)=(−30°, 3.2 seconds); ($\theta 3$, $t3$)=(0°, 2.0 seconds); ($\theta 4$, $t4$)=(+30°, 3.2 seconds); and ($\theta 5$, $t5$)=(+45°, 5.3 seconds).

In the swing motion shown in FIG. 6, rotation is performed from $\theta 1$ to $\theta 5$, and the rotation returns from $\theta 5$ to $\theta 1$, so one cycle is about 28 seconds. The angular velocity for moving between the respective stationary angular positions can be constant or not. In the Second Embodiment, the velocity for moving between the respective stationary angular positions is substantially constant, and the time required for the move is short (within one second per step) when compared to the stationary time ($tn$) at each stationary angular position.

Figure 5:
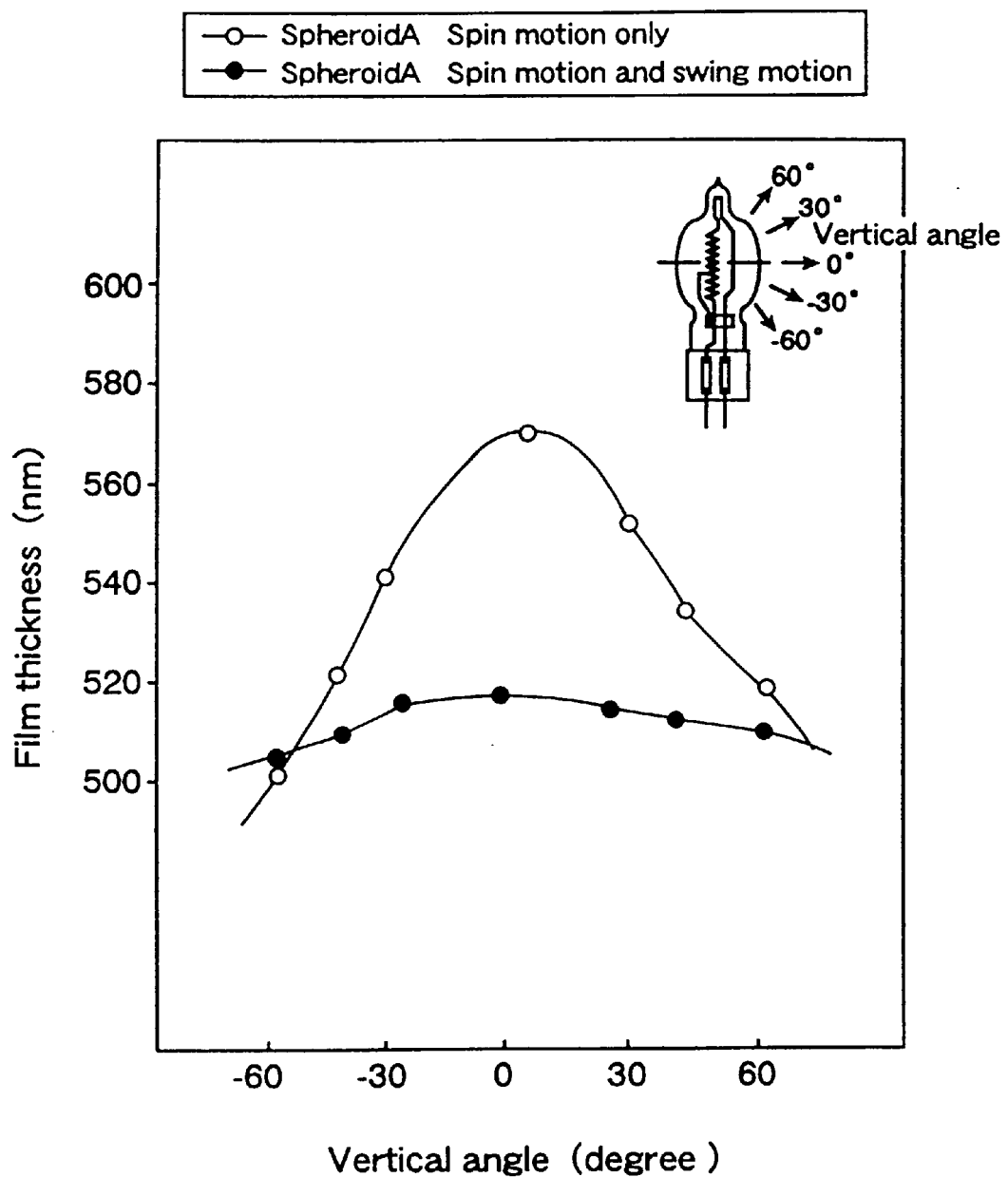
FIG. 5 is a graph to show a relationship between the vertical angle on a light bulb and the thickness of a film, where the film is formed by the method in a second embodiment of the present invention.

FIG. 5 shows a comparison between an example using the step-swing mode in addition to a spin motion, and a comparative example using a spin motion alone. Both the example and comparative example include $SiO_2$ thin films formed on light bulbs by using RF sputtering as in the First Embodiment. Here, light bulbs having spheroid A were used. The target was a flat plate 200 mm in width and 900 mm in length. In the spin motion, the spheroid rotates about the axis of the filament at a regular angular velocity of 100 rpm.

The ordinate and abscissa correspond to those in FIG. 1. FIG. 5 shows that a step-swing mode can provide a uniform film thickness as in the case of a continuous swing mode. The effect is further remarkable when compared with a comparative example of a film formed by using a spin motion alone.

As mentioned above, the film-forming methods in the embodiments provide thin films with a uniform thickness. Therefore, the method for forming films of the present invention is useful in forming interference infrared reflection multilayer films or frost films on light bulbs. Such multilayer films comprise laminates of transparent dielectric multilayer films differing in the refractive indices.

A 90 W tungsten-halogen lamp including a light bulb having a spheroid was prepared by forming an infrared reflection thin film on the spheroid by using a method in the present invention. This lamp was used for a comparison with a tungsten-halogen lamp having the identical total value of luminous flux (1600 lumen) prepared without using the method of the present invention. The efficiency of the present invention (1 m/W) was improved by about 30%.

Frost films to soften the glare of the light bulb also were formed uniformly as the outermost layer on the light bulb.

RF sputtering was used for forming thin films in the embodiments. The film-forming method is not limited thereto as long as the thin films are formed with an incident particle beam coming from a particle source located in a specific direction when viewed from the substrates. Equivalent effects are obtainable in any other general-purpose sputtering such as DC sputtering, or various kinds of evaporation.

Thin films in the above-identified embodiments can be formed by using film-formation equipment having a rotational mechanism for performing a spin motion together with a swing motion, and by combining the film-forming method with conventional evaporation or sputtering.

Consequently, according to the present invention, a thin film with a uniform thickness can be formed with accurate control on a substrate even when incident sputtered particles are supplied from only a specific direction as in a conventional method such as evaporation and sputtering, or even when the substrate comprises a spheroid such as a light bulb.

As a result, even a laminate film comprising transparent dielectric films with different refractive indices can be formed uniformly with accurate control on a curved surface of a light bulb, an efficient and energy-saving light bulb can be manufactured, and the light bulb is protected from light coloration or color unevenness.

The invention may be embodied in other specific forms without departing from the spirit or essential characteristics thereof. The embodiments disclosed in this application are to be considered in all respects as illustrative and not restrictive, the scope of the invention being indicated by the appended claims rather than by the foregoing description, all changes that come within the meaning and range of equivalency of the claims are intended to be embraced therein.

What is claimed is:

1. Film formation equipment for forming a thin film on a substrate comprising a spheroid with an incident particle beam coming from a particle source located in a specific direction when viewed from the substrate, the equipment comprising a rotational mechanism for performing a spin motion together with a swing motion, in which the spin motion is a rotation of the substrate at a constant angular velocity about the spheroidal axis and the swing motion is a rotational oscillation of the same substrate for rotationally oscillating the axis at a constant cycle in one surface, and the center of the rotational oscillation is in the vicinity of the midpoint between two focal points on the axis of the spheroid.

2. The equipment according to claim 1, further comprising a high frequency sputtering or direct current sputtering member for forming the thin film.

* * * * *